(12) United States Patent
Mahoney et al.

(10) Patent No.: US 7,724,528 B2
(45) Date of Patent: May 25, 2010

(54) THERMAL DISSIPATION HEAT SLUG SANDWICH

(75) Inventors: William G. Mahoney, Suwanee, GA (US); William D. Lanum, Stone Mountain, GA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 12/171,869

(22) Filed: Jul. 11, 2008

(65) Prior Publication Data

US 2010/0008046 A1    Jan. 14, 2010

(51) Int. Cl.
*H05K 7/20* (2006.01)
(52) U.S. Cl. .................. 361/719; 361/704; 361/709; 361/715; 165/80.2; 165/80.3; 165/104.33; 257/718; 29/832; 174/16.3
(58) Field of Classification Search .......... 361/688, 361/689, 702–712, 714–722, 732, 756, 760–764; 165/80.2, 80.3, 104.33, 185; 257/695, 696, 257/E23, 706–727; 174/15.1, 15.2, 16.3, 174/252
See application file for complete search history.

(56) References Cited

U.S. PATENT DOCUMENTS

| | | | | |
|---|---|---|---|---|
| 4,756,081 A | * | 7/1988 | Penn | 29/832 |
| 5,696,666 A | * | 12/1997 | Miles et al. | 361/764 |
| 5,739,586 A | | 4/1998 | Cannizzaro et al. | |
| 5,825,625 A | * | 10/1998 | Esterberg et al. | 361/719 |
| 5,856,911 A | * | 1/1999 | Riley | 361/704 |
| 5,930,601 A | | 7/1999 | Cannizzaro et al. | |
| 5,960,535 A | * | 10/1999 | Rubens et al. | 29/832 |
| 6,219,243 B1 | * | 4/2001 | Ma et al. | 361/704 |
| 6,297,959 B1 | * | 10/2001 | Ueno et al. | 361/704 |
| 6,580,611 B1 | * | 6/2003 | Vandentop et al. | 361/704 |
| 6,703,707 B1 | * | 3/2004 | Mamitsu et al. | 257/718 |
| 2007/0297155 A1 | * | 12/2007 | Hebel et al. | 361/760 |

FOREIGN PATENT DOCUMENTS

JP     048222671 A * 8/1966

* cited by examiner

*Primary Examiner*—Michael V Datskovskiy
(74) *Attorney, Agent, or Firm*—Lewinski Law Group LLC (57) ABSTRACT

In one embodiment a thermal dissipation heat slug sandwich includes a circuit board, a circuit package having an integrated heat slug mounted to an obverse side of the circuit board, and a lower heat sink plate on a reverse side of the circuit board thermally coupled to the heat slug and a housing enclosing the circuit board An upper heat sink plate may be mounted to the obverse side of the circuit board to cover the circuit package. The upper heat sink plate thermally coupled to the lower heat sink plate through the circuit board. An insulating cover may also be provided to redirect radiant heat from the circuit package to the housing.

20 Claims, 9 Drawing Sheets

THERMAL DISSIPATION HEAT SLUG SANDWICH

TECHNICAL FIELD

The present disclosure relates generally to heat dissipation assemblies and more particularly to heat sink assemblies for cable television line amplifiers.

BACKGROUND

Wide band amplifiers, such as gallium arsenide field effect transistor (GaAs FET) integrated circuit amplifiers, may be employed in high performance cable television distribution systems. While these wide band amplifiers provide high performance, they use more power and generate more heat than narrow band amplifiers. In general, these conventional heat sink assemblies fail to provide adequate heat management for wide band amplifiers circuits. Consequently, these wideband amplifiers are forced to operate at elevated temperatures which may reduce the life of the transistor and damage other components located within the same housing. Scientific-Atlanta, Inc.'s U.S. Pat. Nos. 5,739,586 and 5,930,601, which are hereby incorporated by reference herein, disclose heat sink assemblies that offer improved heat management capabilities through the use of thermal coupling with a circuit package having an integrated heat slug.

DESCRIPTION OF EXAMPLE EMBODIMENTS

Overview

In an example embodiment, a heat slug sandwich comprises: a circuit board; a circuit package having an integrated heat slug, the circuit package mounted to an obverse side of the circuit board; and a lower heat sink plate on a reverse side of the circuit board, the lower heat sink plate having a protrusion extending through a through hole in the circuit board to thermally couple the lower heat sink plate to the heat slug. The lower heat sink plate may also be thermally coupled to a housing that houses the circuit board to establish a thermal path from the heat slug through the lower heat sink to the housing.

In an example embodiment, a heat slug sandwich may also include an upper heat sink plate mounted to the obverse side of the circuit board that covers the case of the circuit package to provide a thermal path for heat away from the case. The upper heat sink plate may be thermally coupled to the lower heat sink plate through the circuit board to establish a thermal path from the case of the circuit package, through the upper heat sink plate, through the lower heat sink plate, and into the housing. In one example embodiment, bolt through holes are provided through the top heat sink plate, the circuit board, the bottom heat sink plate and the housing. A bolt may be inserted therethrough to squeeze the heat sink plates, circuit board, and housing together. The circuit board's bolt through holes may be sized so that a sleeve surrounding and extending upward from the bolt through hole of the lower heat sink plate extends through the circuit board to contact a portion of the upper heat sink plate. The circuit board bolt hole may also be plated with thermally conductive material to assist in establishing a thermal flow path between the upper and lower heat sink plates.

A thermally insulating cover may also be provided that is adapted to couple to and cover the upper heat sink plate to direct heat radiating from the circuit package and upper heat sink plate away from the interior of the housing. A flexible thermal pad may be placed between the upper heat sink plate and the circuit package to allow the upper heat sink plate to be tightened down atop the circuit package without damaging the circuit package. Thermal grease or solder may also be used for coupling the heat sink plates to the heat slug or each other. For example, a protrusion of the lower heat sink plate extending through the circuit board may be soldered to a bottom surface of the heat slug.

In an example embodiment, the lower heat sink plate may comprise a generally flat thermally conductive body adapted to couple to a reverse side of a printed circuit board. The body may have a protrusion for extending through the circuit board to thermally contact a heat slug of a circuit package mounted on the obverse side of the circuit board. In an example embodiment, the protrusion has a contact surface shaped to correspond to the shape of the heat slug. The lower heat sink plate may have a sleeve surrounding a bolt through hole and extending upward to extend through a reverse side of the circuit board to thermally couple with the upper heat sink plate on the obverse side of the circuit board. The body may have a generally planar top surface for abutting the reverse surface of the circuit board, and a generally planar bottom surface for thermally coupling with the casing.

In an example embodiment, the upper heat sink plate may comprise a thermally conductive body adapted to couple to an obverse side of a printed circuit board and to cover a circuit package mounted the circuit board. The upper heat sink plate may have a bolt through hole sized so that a portion of the upper heat sink plate extends over a bolt through hole of the circuit board to thermally couple with the sleeve of the lower heat sink plate extending through the circuit board bolt hole. A thermally insulating cover may be provided to cover the upper heat sink plate and reduce heat radiation from the upper heat sink plate into the interior of the housing that houses the circuit board.

DETAILED DESCRIPTION

While example embodiments are disclosed herein, it will be understood that the invention may be embodied in various alternative forms. For example, while the example embodiments disclosed herein are discussed mainly in the context of a heat slug sandwich used in a cable television amplifier node housing, it will be understood that the invention may be embodied in many different forms and should not be construed as being limited to the embodiments set forth herein. Rather, the embodiments are provided so that this disclosure will be thorough and complete, and will fully convey the scope of the invention to those skilled in the art.

The accompanying drawings depict example embodiments of the invention in which like numerals represent like elements throughout the several figures. The drawings are not necessarily to scale and some features may be exaggerated or minimized to show details of particular elements, while related elements may have been eliminated to prevent obscuring novel aspects. Therefore, specific structural and functional details disclosed herein are not to be interpreted as limiting, but merely as a basis for the claims and as a representative basis for teaching one skilled in the art to variously employ the present invention.

In the following description and claims, the term "coupled" along with its derivatives, may be used. "Coupled" may mean that two or more elements are in direct physical or thermal contact. However, "coupled" may also mean that two or more elements are not in direct contact with each other, but yet still cooperate or interact with each other, such as when two elements are thermally coupled to one another when they are in thermal communication but not directly touching, such as when there is an intervening thermally conductive element therebetween.

Figure 1:
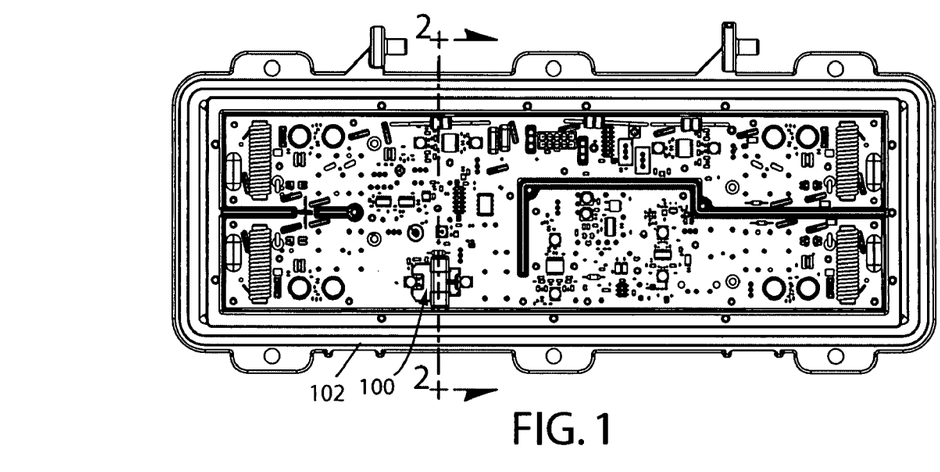
FIG. 1 illustrates an example embodiment of a heat slug sandwich for managing heat in an enclosure.
Figure 2:
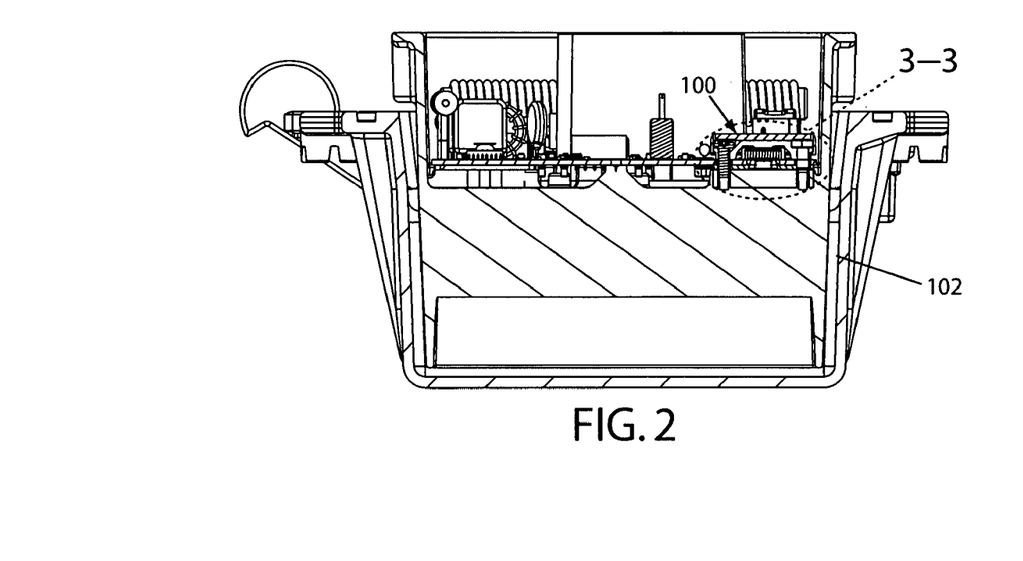
FIG. 2 illustrates a cutaway view along line 2-2 of FIG. 1.
Figure 3:
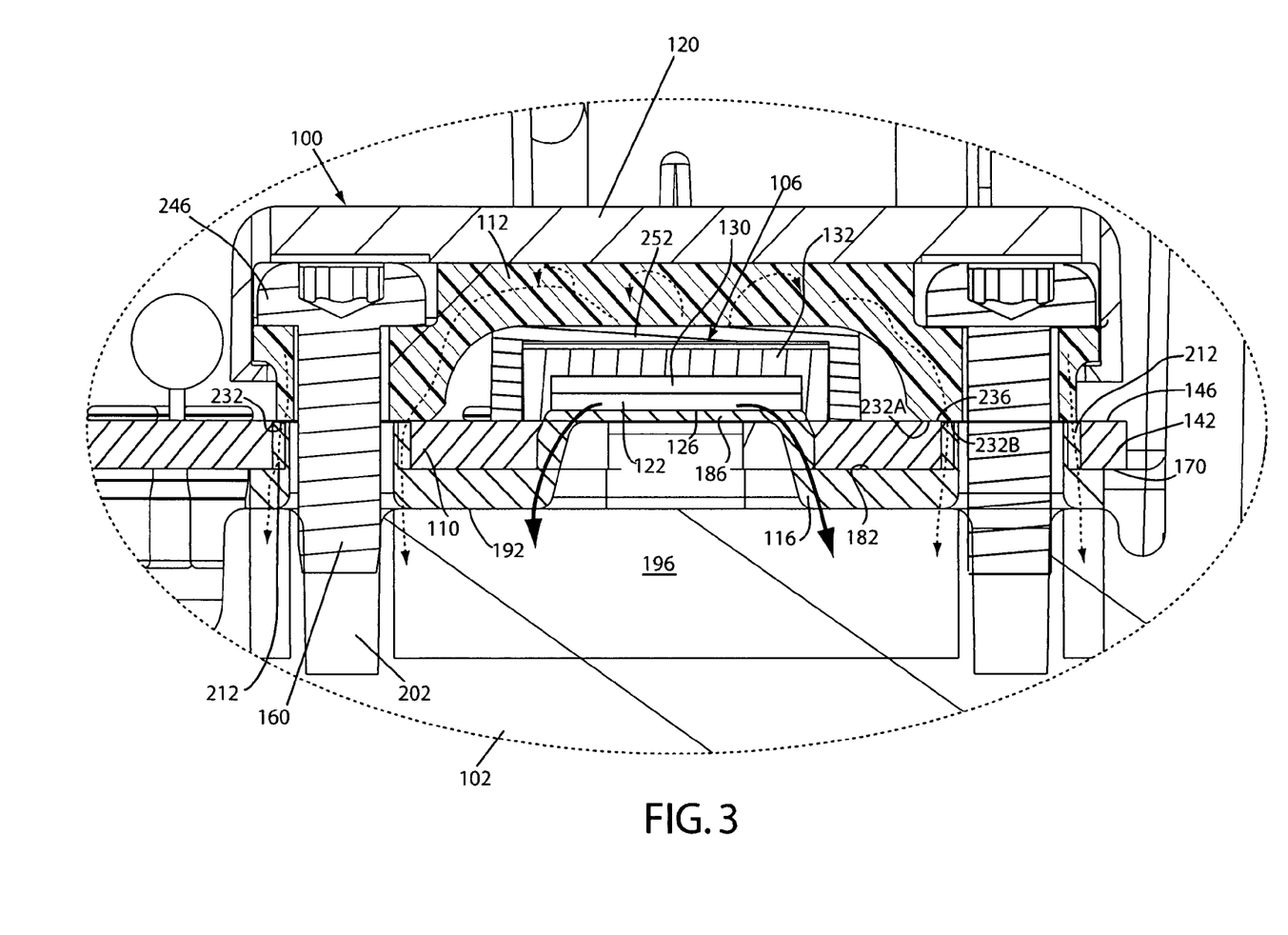
FIG. 3 illustrates an enlarged view along magnification line 3-3 of FIG. 2.

Turning now to the figures, FIGS. 1 and 2 illustrate an example embodiment of a heat slug sandwich 100 installed within a housing 102, such as a Community Access Television (CATV) node housing. As seen in FIG. 3, in one example embodiment a heat slug sandwich 100 may include a circuit package 106 mounted to a printed circuit board (PCB) 110, an upper heat sink plate 112, a lower heat sink plate 116, and a cover 120. The heat slug sandwich 100 provides a thermal path for directing heat away from the circuit package 106 into the housing 102.

Figure 5:
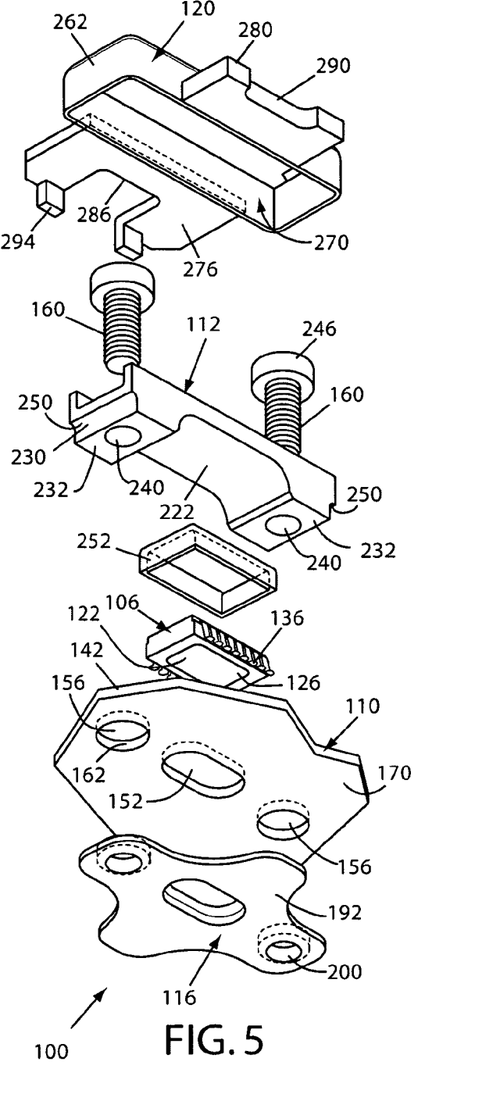
FIG. 5 illustrates a bottom exploded view of an example embodiment of a heat slug sandwich.
Figure 6:
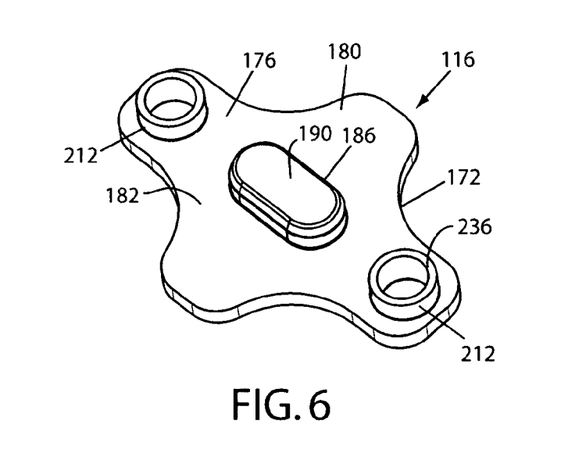
FIG. 6 illustrates a perspective view of an example embodiment of a lower heat sink plate for use with a heat slug sandwich.
Figure 7:
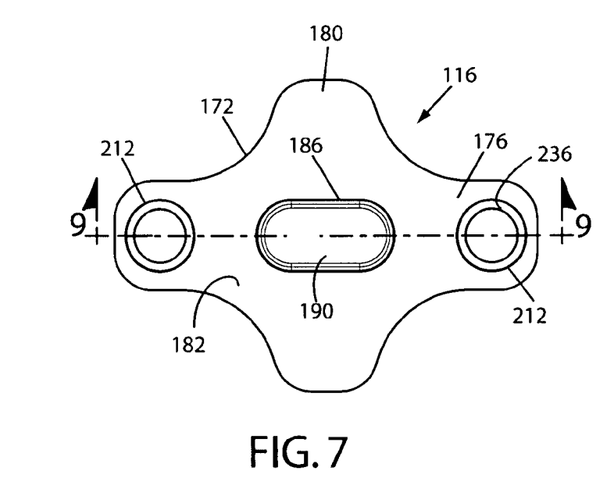
FIG. 7 illustrates a top view of an example embodiment of a lower heat sink plate for use with a heat slug sandwich.
Figure 8:
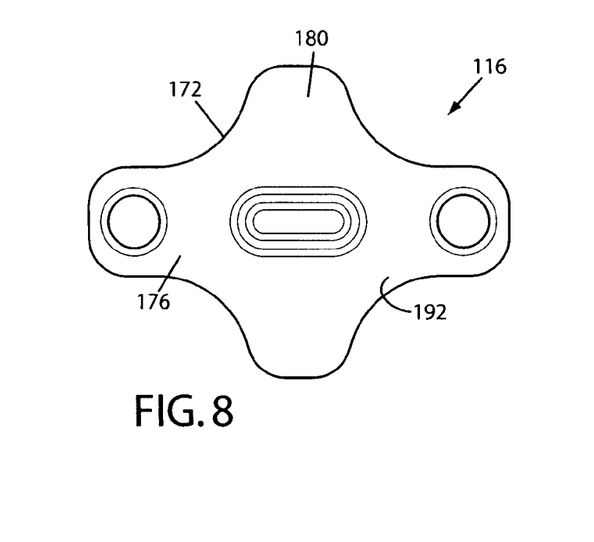
FIG. 8 illustrates a bottom view of an example embodiment of a lower heat sink plate for use with a heat slug sandwich.
Figure 9:
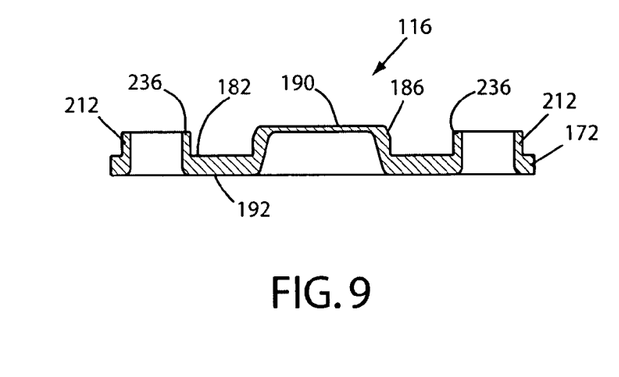
FIG. 9 illustrates a cutaway view along line 9-9 of FIG. 7.
Figure 10:
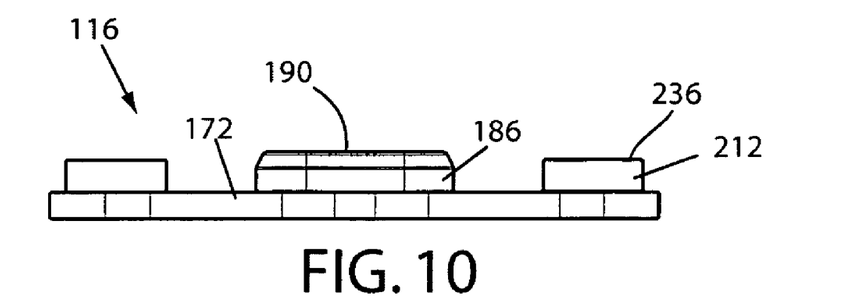
FIG. 10 illustrates a front view of an example embodiment of a lower heat sink plate for use with a heat slug sandwich.
Figure 11:
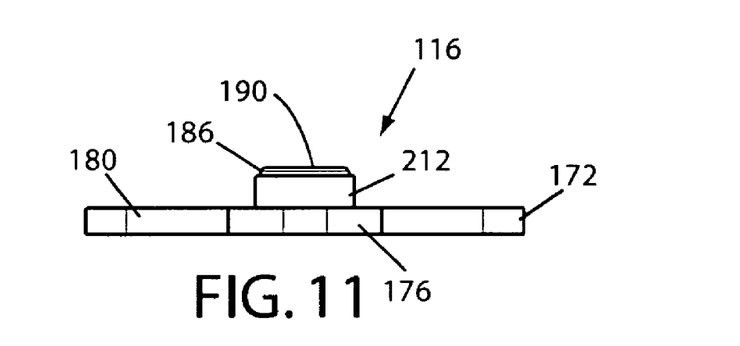
FIG. 11 illustrates a side view of an example embodiment of a lower heat sink plate for use with a heat slug sandwich.
Figure 12:
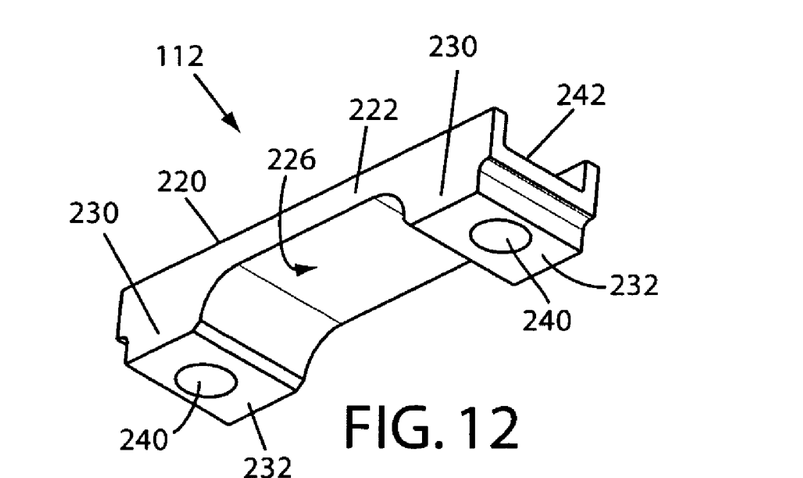
FIG. 12 illustrates a perspective view of an example embodiment of an upper heat sink plate for use with a heat slug sandwich.
Figure 13:
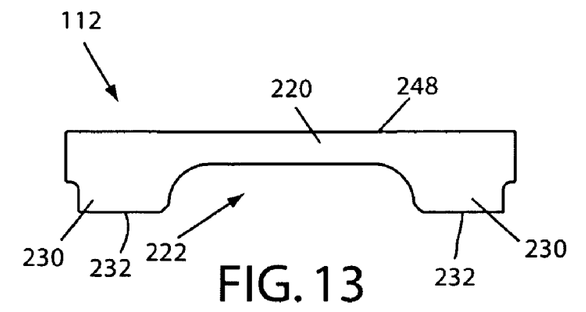
FIG. 13 illustrates a front view of an example embodiment of an upper heat sink plate for use with a heat slug sandwich.
Figure 14:
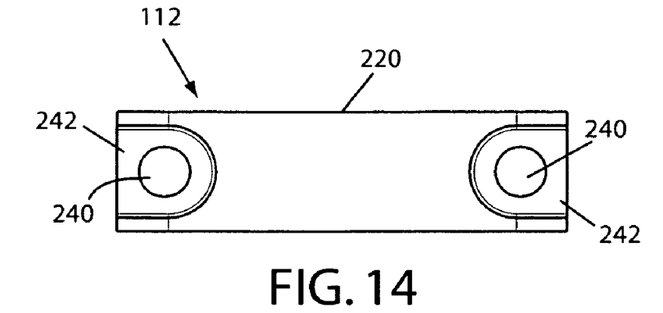
FIG. 14 illustrates a top plan view of an example embodiment of an upper heat sink plate for use with a heat slug sandwich.
Figure 15:
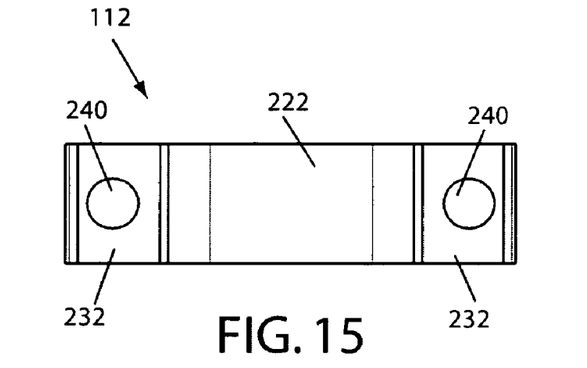
FIG. 15 illustrates a bottom view of an example embodiment of an upper heat sink plate for use with a heat slug sandwich.
Figure 16:
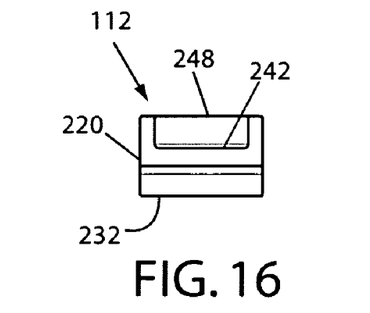
FIG. 16 illustrates a right side view of an example embodiment of an upper heat sink plate for use with a heat slug sandwich.
Figure 17:
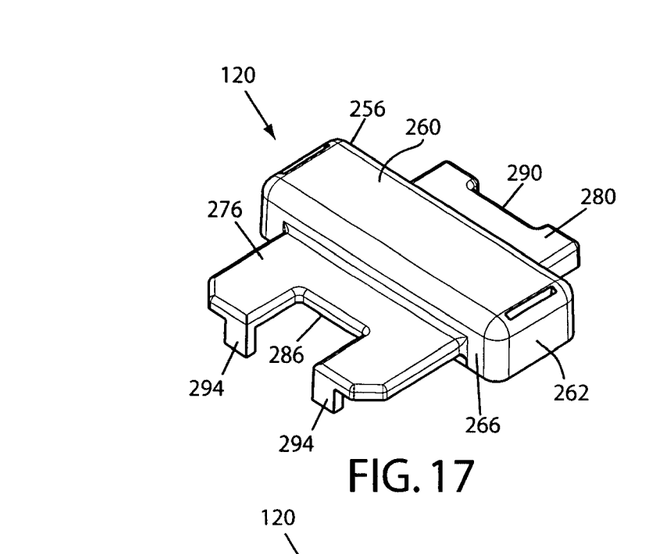
FIG. 17 illustrates a perspective view of an example embodiment of an insulating cover for use with a heat slug sandwich.
Figure 18:
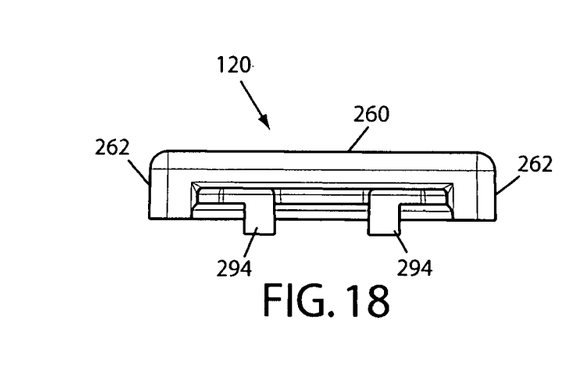
FIG. 18 illustrates a front view of an example embodiment of an insulating cover for use with a heat slug sandwich.
Figure 19:
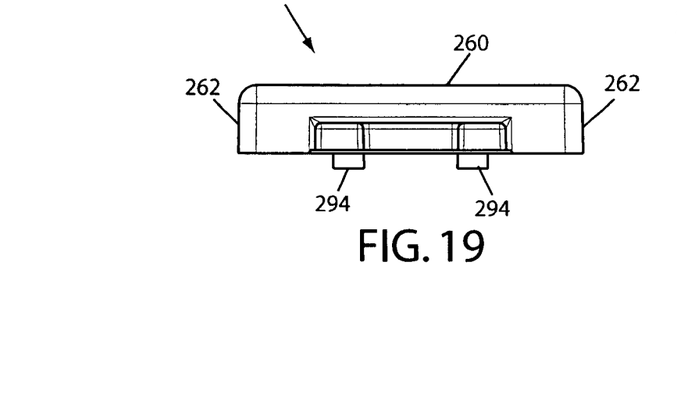
FIG. 19 illustrates a rear view of an example embodiment of an insulating cover for use with a heat slug sandwich.
Figure 20:
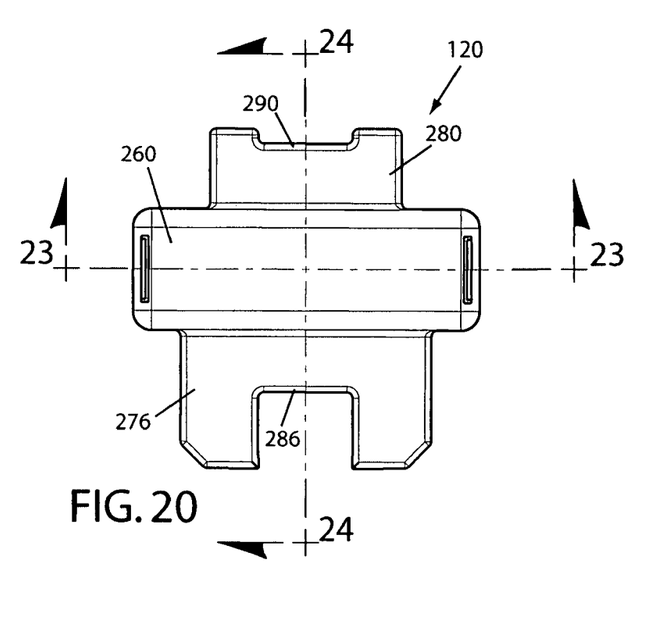
FIG. 20 illustrates a top plan view of an example embodiment of an insulating cover for use with a heat slug sandwich.
Figure 21:
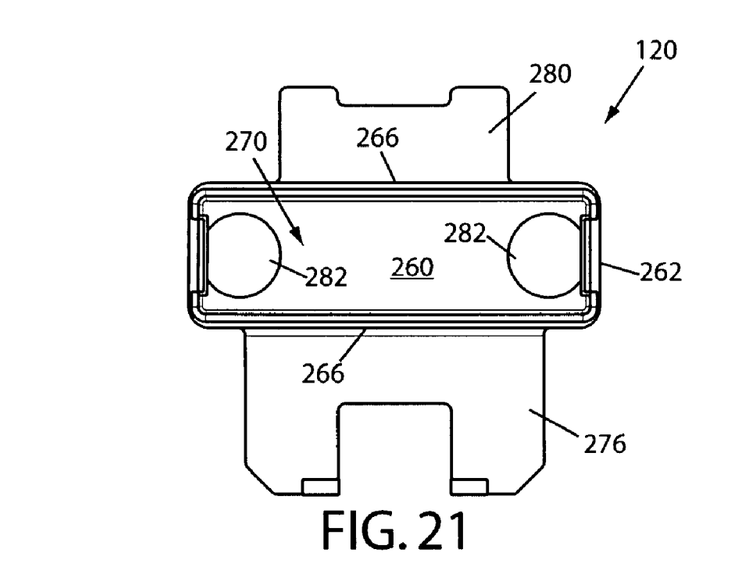
FIG. 21 illustrates a bottom view of an example embodiment of an insulating cover for use with a heat slug sandwich.
Figure 22:
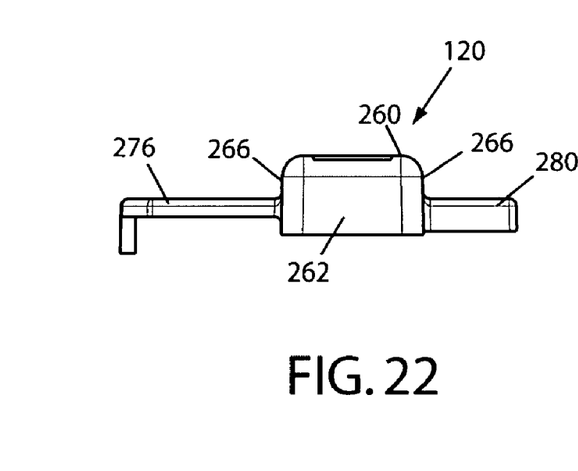
FIG. 22 illustrates a right side view of an example embodiment of an insulating cover for use with a heat slug sandwich.
Figure 23:
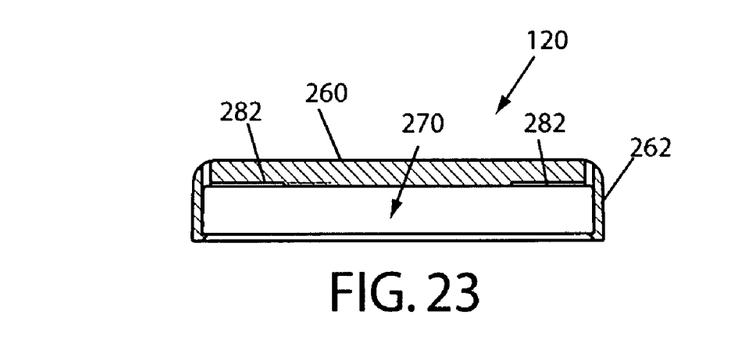
FIG. 23 illustrates a cutaway view along cut line 23-23 in FIG. 20.
Figure 24:
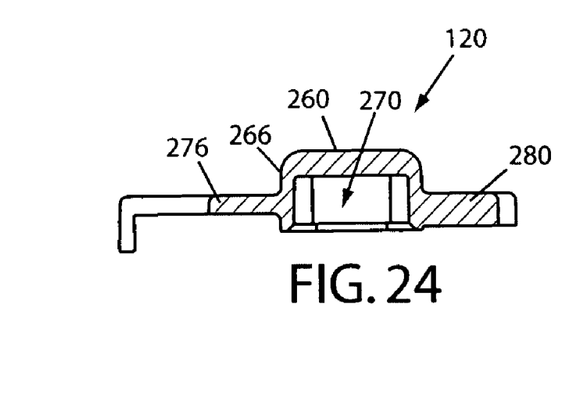
FIG. 24 illustrates a cutaway view along cut line 24-24 in FIG. 20.

The circuit package 106 may include a heat dissipating circuit 130, such as a gain-block GaAs FET amplifier integrated circuit used in a cable television line amplifier, such as Scientific-Atlanta, Inc.'s, Gainmaker® series amplifier. The circuit package 106 may further include a metal heat slug 122 formed from tin-plated copper or other thermally conductive material integrally formed with the circuit package 106. The heat dissipating circuit 130 may be euteticly bonded to an obverse surface of the heat slug 122 by brazing or soldering alloy with a melting temperature sufficiently above the temperature of lead tin solder so that subsequent soldering operations do not remelt the bond. As shown in FIG. 5, the heat slug 122 may be generally oval-shaped and have a lower surface 126.

A case 132 may enclose the amplifier integrated circuit 130 and the heat slug 122 and be formed of materials selected for other properties, such as plastic to provide a hermetic seal. Leads 136 may extend out of the circuit package 106 for attachment with pads 140 (FIG. 4) formed on the obverse surface of the PCB 110. The PCB 110 may be a multilayer printed wiring board, such as one formed of a substrate made of epoxy-fiberglass or Flame Retardant 4 (FR4) or other material having copper cladding on its obverse 146 and reverse 170 surfaces. The copper cladding may be etched to leave desired circuit wiring, ground planes, etc. Bolt through holes 156 may be drilled in the PCB 110 and the PCB 110 may be prepared for component mounting, for example, by tin plating. The pads 140 may be formed of a copper sheet clad to substrate 142 by patterning and etching.

Figure 4:
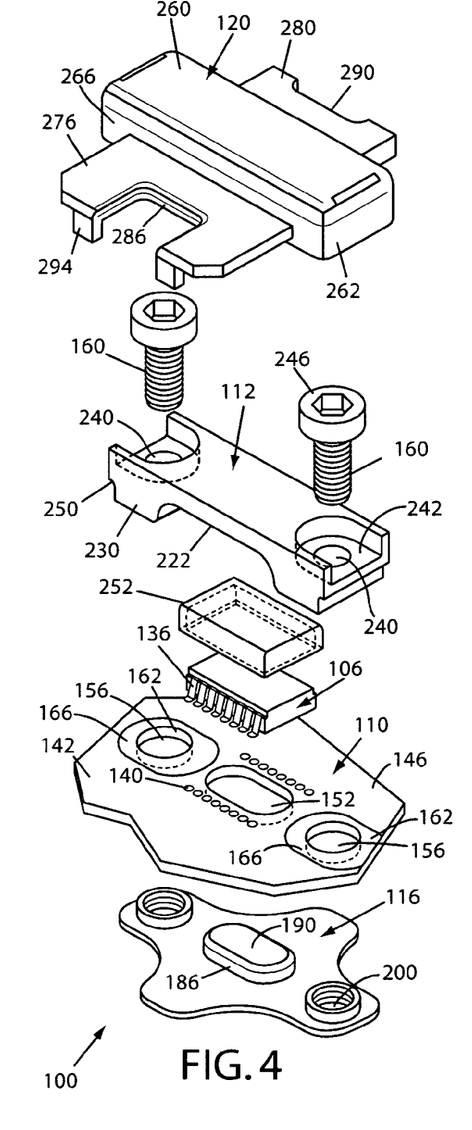
FIG. 4 illustrates a top exploded view of an example embodiment of a heat slug sandwich for heat dissipation.

As shown in FIGS. 3-5, the circuit package 106 may be electrically coupled and mounted to an obverse side 146 of the PCB 110 so that a bottom surface 126 of the heat slug 122 faces the obverse surface 146 of the PCB 110. For example, leads 136 of the circuit package 106 may be soldered to the solder pads 140. The PCB 110 may have a generally oval-shaped through hole 152 aligned with the heat slug 122 so that the bottom surface 150 of the heat slug 122 is accessible through the PCB 110.

The bolt holes 156 may be plated through holes to assist in establishing a thermal path between the upper 112 and lower 116 heat sink plates, as described in more detail below. For example, during the process of fabricating the printed wiring board 110, copper plating may form a copper sleeve 162 inside the bolt hole 156 and provide a contact surface 166 on the obverse surface 146 of the printed circuit board 110 (FIG. 4). The whole copper clad board may be tin plated to avoid oxidation.

As seen in FIGS. 1-5, a lower heat sink plate 116 may be coupled to a reverse side 170 of the PCB 110 and be thermally coupled to the heat slug 122 and the housing 102. As shown in FIGS. 6-11, the lower heat sink plate 116 may include a generally planar thermally conductive body 172 having pairs of opposing wings 176 and 180 and having a generally planar top surface 182 for contacting the reverse surface 170 of the PCB 110. The lower heat sink plate 116 may also have a center protrusion 186 having a generally planar upper contact surface 190 for contacting the lower surface 126 of the heat slug 122. As shown in FIGS. 4 and 5, the contact surface 190 of the lower heat sink plate 116 may be shaped to correspond to the generally oval-shape of the exposed heat slug lower surface 126 (and the PCB main through hole 152) to provide maximum contact therebetween. The protrusion 186 may be configured so that when the lower heat sink plate 116 is coupled to the PCB 110 as shown in FIG. 3, the protrusion 186 extends upward through the through hole 152 of the PCB 110 beyond the obverse surface 146 of the PCB 110 to contact the lower surface 126 of the heat slug 122. This establishes a thermal coupling between the heat slug 122 and the lower heat sink plate 116 protrusion 186. The upper contact surface 190 of the lower heat sink plate 116 may be bonded to and thermally coupled to the bottom surface 126 of the heat slug 122 by a solder film (not shown).

The lower heat sink plate 116 may also be thermally coupled to the housing 102. For example, as also seen in FIG. 3, the lower heat sink plate 116 may include a generally planar bottom surface 192 for contacting a protrusion 196 of the housing 102 to establish a thermal path between the heat sink plate 116 and the housing 102. A thermal flow path shown by solid arrows is thereby established from the heat slug 122 of the circuit package 106, through the lower heat sink plate 116 into the housing 102. The wings 176, 180 provide a large conductive path between the lower heat sink plate 116 and the housing 102. The lower heat sink 116 may be made of copper alloy 110 or other thermally conductive material.

Bolt through holes 200 may be provided on opposed wings 176 of the lower heat sink plate 116 and adapted for alignment with the bolt through holes 156 of the PCB 110 and bolt receiving holes 202 provided in bolt protrusions 206 of the housing 102. The bolts 160 may extend through the lower heat sink plate 116 and the PCB 110 and into the housing 102 to squeeze the PCB 110, lower heat sink plate 116 and the housing 102 together.

FIG. 3 depicts the heat slug sandwich 100 with the circuit board 110 (and circuit package 106 mounted thereon) installed in the metal housing 102. The housing 102 may be an enclosure for enclosing the circuit board 110 therein such as a cable node housing made from diecast aluminum, such as 380 alloy. As shown in FIG. 3, the housing 102 may have a planar protrusion 196 to thermally confront the lower surface 192 of the lower heat sink plate 116. The lower heat sink 116 may also include upwardly extending sleeves 212 which may extend upward about the bolt holes 200 of the lower heat sink plate 116. The sleeve 212 may be sized to extend upward through the PCB bolt hole 156 so that the upper end 236 of the sleeve 212 is generally flush with the obverse surface 146 of the substrate to contact a lower surface 232 of the upper heat sink plate 112 as described in more detail below. In addition, the sleeve 212 may contact the thermally conductive plating 162 (FIG. 4) within the plated bolt hole 156.

Although most of the heat generated from the circuit package 106 will be transferred through the heat slug 122 to the lower heat sink plate 116 through the contact of the protrusion 186 with the heat slug 122, some heat may build up in the case 132 of the circuit package 106, especially in high performance IC chips are used. The heat from the case 132 may radiate into the air within the housing 102 and elevate the temperature within the enclosure by several degrees and decrease the life of the components housed therein and lead to increased cooling costs. This radiant heat may be redirected to the housing an upper heat sink plate 112 as will now be described.

As shown in FIGS. 12-16 an upper heat sink plate 112 may be adapted for mounting to the obverse surface 146 of the substrate 142 to cover the circuit package 106. The upper heat sink plate 112 may include a thermally conductive body 220 having an archway 222 the interior of which defines a receiving space 226 for covering the top of the circuit package 106. Whereas the lower heat sink plate 116 is coupled to and conducts heat from the heat slug 122 of the circuit package 106, the upper heat sink 112 may be adapted for directing radiant heat from the circuit package 106 to the housing 102 to decrease the temperature within the enclosure.

The upper heat sink plate 112 may include mounting legs 230 provided at opposite ends of the archway 222 that include a generally planar bottom surface 232. A bolt through hole 240 may be provided through each mounting leg 230 that is adapted to align with the PCB bolt hole 156 and the lower heat sink bolt hole 200 when the upper heat sink plate is coupled to the PCB 110. A recess 242 may be provided at the top of the mounting leg 230 so a bolt head 246 is recessed from the top surface of the upper heat sink plate 112. An outer side of the mounting legs 230 may include shoulders 250 that are adapted for securing the insulating cover 120 to the upper heat sink plate 112. The upper heat sink plate 112 may be made of a thermally conductive material such as copper alloy 110 or similar material.

As seen in FIG. 3 the upper heat sink plate 112 may be mounted to the obverse side 146 of the PCB 110 to cover the circuit package 106 so the circuit package 106 is within the archway 222. As seen in FIGS. 4 and 5, a flexible thermal pad 252, such as a non-electrically conductive pad that may have glass fill or silica beads that provides a desired thermal conductivity, may be placed between the circuit package 106 and the upper heat sink plate. This minimizes the stresses on the circuit package 106 when the upper heat sink plate 112 is tightened down atop the circuit package 106.

When the upper heat sink plate 112 is coupled to the PCB 110, the bottom surface 232 of the mounting legs 230 may be generally flush with the obverse side 146 of the PCB 110. The bolt holes 156 in the PCB 110 may be sized to allow the sleeve 212 of the lower heat sink plate 116 to extend upward through the PCB bolt holes 156 to the obverse surface 146 of the PCB 110 so an end 236 of the sleeves 212 contacts the bottom surface 232 of the upper heat sink plate 112. This establishes a thermal path shown by dashed lines in FIG. 3 from the circuit package 106, through the upper heat sink plate 112, through the lower heat sink plate 116, and into the housing 102. For example, a first portion 232A of the bottom surface 232 of the upper heat sink plate 112 may contact the obverse surface 146 of the PCB 110 and a second portion 232B may extend over the PCB bolt hole 156 to contact the upper lip 236 of the lower heat sink plate sleeve 212. Bolts 160 may be inserted through the upper heat sink plate holes 240, the PCB bolt holes 156, lower heat sink plate bolt holes 200, and into housing bolt holes 202 and tightened down to squeeze the upper heat sink plate 112, lower heat sink plate 116, PCB 110, and housing 102 together to establish good thermal contact.

As previously mentioned, the PCB bolt hole 156 may be plated to provide a contact surface 166 on the obverse side 146 of the PCB 110 and an inner sleeve 162 to further establish a thermal path between the upper 112 and lower 116 heat sink plates. For example, the bottom surface 232 of the upper heat sink plate 112 may contact the contact surface 166 and the sleeve 212 of the lower heat sink plate contact the inner plating of the bolt hole 156 to further establish thermal coupling between the heat sink plates 112, 116. Additional thermal conductive layers may also be provided. For example, thermal grease (not shown), such as Dow Corning® 340, may be provided between the heat sink plates 112, 116 and the PCB 110.

As shown in FIG. 3, a thermally insulating cover 120 may also be provided to prevent heat from the circuit package 106 from elevating the temperature within the interior space of the housing 102. As shown in FIGS. 17-24, the insulating cover 120 may include a main insulating body 256. The cover 120 may be made of antistatic nylon or other insulating material and configured for coupling to and covering the upper heat sink plate 112. The main cover body 256 may include a top 260 and end walls 262 and sidewalls 266 extending downward from the top 260 to form an opened bottom receiving space 270 for receiving the upper heat sink plate 112. Major 276 and minor 280 generally planar extensions may extend outward on opposing sides of main body 256. to act as a protective cover for delicate components on the PCB 110.

A bolt recess 282 may be provided on the underside of the top 260 to provide a space between the cover 120 and the bolts 160 when the cover is attached to the upper heat sink plate 112. The ends 286 of the end walls 262 may be curved to engage the shoulders 250 of the upper heat sink plate 112 to secure the cover 120 to the upper heat sink plate 112. Because the cover 120 is thermally insulating, heat that flows into the upper heat sink plate 112 from the circuit package 106 will flow away from the cover 120 and downward to the lower heat sink plate 116 along the dashed flow path shown in FIG. 3.

The major 276 and minor 280 extensions of the cover may be shaped in accordance with the various components mounted on the obverse surface of the PCB 110. For example, when installed within a node housing as shown in FIG. 1, the cover 120 may include cutouts 286 and 290 to allow access to components that are tuned during manufacturing. The major extension 276 may include downwardly extending tabs 294 to abut the obverse surface 146 of the PCB 110.

Figure 25A:
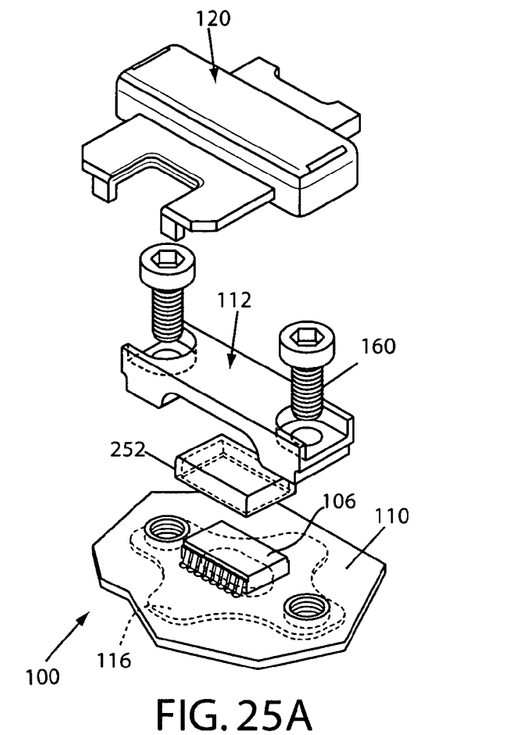
FIGS. 25A-D illustrate an example method of assembling an example embodiment of a heat slug sandwich.

As seen in FIGS. 25A-25D to assemble the heat slug sandwich 100, the circuit package 106 may be soldered to the PCB 100. The PCB 110 may also mount components that are through-hole mounted. In this case, components may be mounted, either by hand or by machine, and the assembled printed wiring board wave soldered in a wave soldering machine. The circuit package 106 may be mounted on the PCB 110, such as by using a surface mount placement machine. The PCB 110 with mounted circuit package 106 may be passed through an infra red heat reflow oven, to melt solder paste over pads 140 to bond the leads 136 to corresponding pads 140. Solder paste may also be provided over the protrusion 186 of the lower heat sink plate 116 to bond the protrusion 186 to the heat slug 122 (FIG. 25A).

Figure 25B:
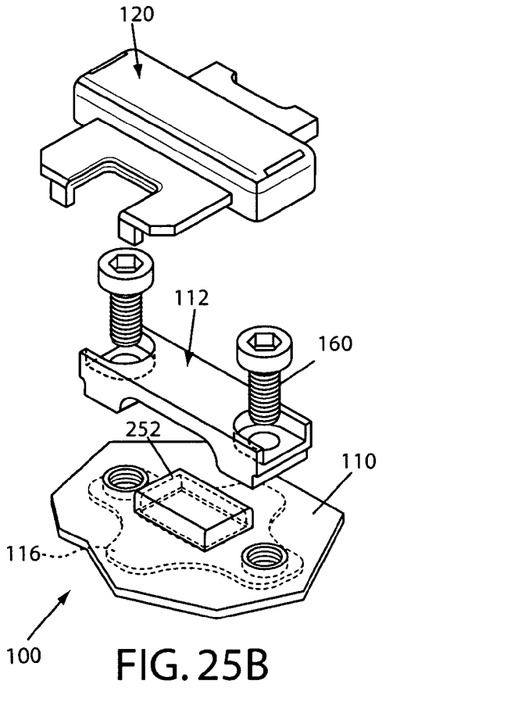
Figure 25C:
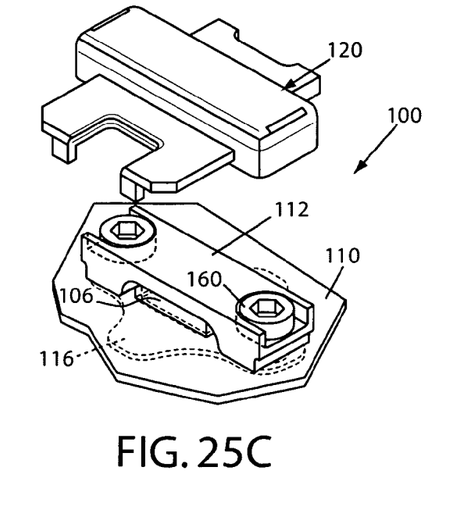
Figure 25D:
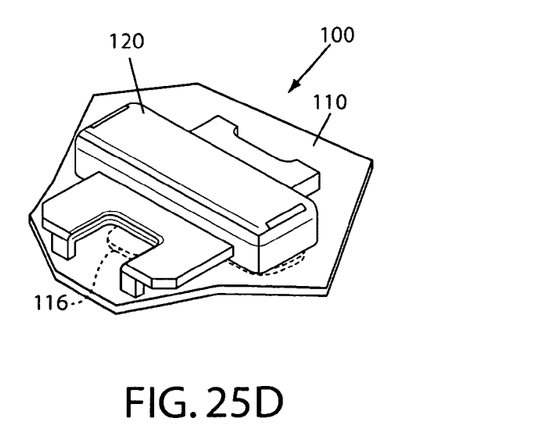

As shown in FIG. 25B the thermal pad 252 may be placed atop the circuit package 106. As shown in FIG. 25C bolts 160 may be inserted through bolt holes 240, 156, and 200 of the upper heat sink plate 112, PCB 110, and lower heat sink plate 112 and into the housing 202. The bolts 160 may be tightened down to squeeze the components together to form desired thermal paths as described above. The insulating cover 120 may them be placed atop the upper heat sink plate 112 as shown in FIG. 25D.

Bolts 160 may be installed through bolt holes in the upper sink plate 112, holes 156 in the PCB 110, holes 200 in the lower heat sink plate 116 and into the protrusion portions 206 of the housing 102. As the bolts 160 are tightened, excess grease may be squeezed out of the gaps between the components. The heat slug 100 may be generally oval in shape measuring 0.180 inches by 0.360 inches. The quality of the thermal coupling and bond between heat slug 122 and the protrusion 186 of the lower heat sink plate 116 may be adversely effected by a rough surface on the bottom 126 of heat slug 122. Improved performance results when the bottom 126 of the heat slug 122 is co-planar to within 0.007 inches, preferably within 0.004 inches. Similarly, the thermal coupling between the lower contact surface 192 of the lower heat sink plate 116 may be co-planar with the protrusion 196 of the housing 102.

In an embodiment in which a heat slug sandwich 100 has been employed in a node housing, has provided a decrease in the temperature of the case 132 of the circuit package by 6°-7° C. A decrease in the air temperature within the enclosure has been decreased by 3° C. by employing several heat slug sandwiches 100 in a node housing.

The foregoing has broadly outlined some of the more pertinent aspects and features of the present invention. These should be construed to be merely illustrative of some of the more prominent features and applications of the invention. Other beneficial results can be obtained by applying the disclosed information in a different manner or by modifying the disclosed embodiments. Accordingly, other aspects and a more comprehensive understanding of the invention may be obtained by referring to the detailed description of the exemplary embodiments taken in conjunction with the accompanying drawings, in addition to the scope of the invention defined by the claims.

What is claimed is:

1. An apparatus comprising:
   a printed circuit board;
   a circuit package mounted to an obverse side of the printed circuit board, the circuit package having a heat slug;
   a lower heat sink plate mounted to a reverse side of the printed circuit board, the lower heat sink plate having a protrusion extending through the printed circuit board to thermally couple to the metal slug;
   an upper heat sink plate mounted to the obverse side of the printed circuit board and thermally coupled to the circuit package, wherein the upper heat sink plate is thermally coupled to the lower heat sink plate through the printed circuit board; and
   an insulating cover coupled to the upper heat sink plate.

2. The apparatus of claim 1, wherein the protrusion is configured to match the shape of the heat slug.

3. The apparatus of claim 1 wherein the upper heat sink plate and the lower heat sink plate are thermally coupled through a bolt hole in the printed circuit board.

4. The apparatus of claim 1, wherein the lower heat sink plate is thermally coupled to a housing.

5. The apparatus of claim 1, further comprising a flexible thermal pad between the upper heat sink plate and the circuit package.

6. The apparatus of claim 1, wherein the upper heat sink plate has a generally planar contact surface for abutting the obverse side of the printed circuit board.

7. The apparatus of claim 1, further comprising bolts extending through the upper heat sink plate, the printed circuit board, the lower heat sink plate, and into a housing of the printed circuit board.

8. The apparatus of claim 1, wherein the upper heat sink plate has a contact surface configured to extend over a bolt hole in the printed circuit board to establish thermal contact with a sleeve of the lower heat sink plate extending through the bolt hole.

9. The apparatus of claim 1, wherein the upper heat sink plate has a shoulder adapted to couple to an insulating cover.

10. An apparatus comprising:
    a printed circuit board;
    a circuit package mounted to an obverse side of the printed circuit board, the circuit package having a beat slug;
    a lower beat sink plate mounted to a reverse side of the printed circuit board, the lower beat sink plate having a protrusion extending through the printed circuit board to thermally couple to the metal slug; and
    an upper heat sink plate mounted to the obverse side of the printed circuit board and thermally coupled to the circuit package, wherein the upper heat sink plate is thermally coupled to the lower heat sink plate through the printed circuit board and wherein the lower heat sink plate further comprises a sleeve for extending through a bolt hole of the printed circuit board.

11. The apparatus of claim 10, wherein the protrusion is configured to match the shape of the heat slug.

12. The apparatus of claim 10, further comprising an insulating cover coupled to the upper heat sink plate.

13. The apparatus of claim 10, wherein the upper heat sink plate and the lower heat sink plate are thermally coupled through a bolt hole in the printed circuit board.

14. The apparatus of claim 10, wherein the lower heat sink plate is thermally coupled to a housing.

15. The apparatus of claim 10, further comprising a flexible thermal pad between the upper heat sink plate and the circuit package.

16. The apparatus of claim 10, wherein the upper heat sink plate has a generally planar contact surface for abutting the obverse side of the printed circuit board.

17. The apparatus of claim 10, further comprises bolts extending through the upper heat sink plate, the printed circuit board, the lower heat sink plate, and-into a housing of the printed circuit board.

18. The apparatus of claim 10, wherein the upper heat sink plate has a contact surface configured to extend over a bolt hole in the printed circuit board to establish thermal contact with a sleeve of the lower heat sink plate extending through the bolt hole.

19. A method comprising:
conducting heat from a case of a circuit package mounted to an obverse side of a printed circuit board to an upper heat sink plate mounted on the obverse side of the circuit board;
conducting heat from the upper heat sink plate through the printed circuit board to a lower heat sink plate mounted to a reverse side of the circuit board; and
conducting heat from the lower heat sink plate to a housing; and
insulating the upper heat sink plate.

20. The method of claim 19, wherein the step of conducting heat from the upper heat sink plate through the printed circuit board to a lower heat sink plate coupled to a reverse side of the circuit board comprises conducting heat from the upper heat sink plate to a sleeve of the lower heat sink plate extending through a bolt hole of the printed circuit board.

* * * * *